US010262875B2

(12) United States Patent
Kogure et al.

(10) Patent No.: US 10,262,875 B2
(45) Date of Patent: Apr. 16, 2019

(54) HIGH-FREQUENCY MODULE (71) Applicant: Murata Manufacturing Co., Ltd., Kyoto (JP)

(72) Inventors: Takeshi Kogure, Kyoto (JP); Atsushi Ono, Kyoto (JP); Hiroyuki Nagamori, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 112 days.

(21) Appl. No.: 15/631,473

(22) Filed: Jun. 23, 2017

(65) Prior Publication Data
US 2017/0301561 A1 Oct. 19, 2017

Related U.S. Application Data (63) Continuation of application No. PCT/JP2015/084487, filed on Dec. 9, 2015.

(30) Foreign Application Priority Data

Dec. 25, 2014 (JP) .................................. 2014-261517

(51) Int. Cl.
*H01L 21/50* (2006.01)
*H04B 1/00* (2006.01)
(Continued)

(52) U.S. Cl.
CPC .......... *H01L 21/50* (2013.01); *H01L 23/3121* (2013.01); *H01L 23/5389* (2013.01);
(Continued)

(58) Field of Classification Search
CPC ............. H04B 1/38; H04B 1/40; H04B 1/406
(Continued)

(56) References Cited

U.S. PATENT DOCUMENTS

2011/0136554 A1* 6/2011 Wong .................. H04M 1/0208
455/575.4
2014/0119407 A1* 5/2014 Miller .................... H04B 1/713
375/133

FOREIGN PATENT DOCUMENTS

JP 2004-260739 A 9/2004
JP 2005-244336 A 9/2005
(Continued)

OTHER PUBLICATIONS

International Search Report Issued in Patent Application No. PCT/JP2015/084467 dated Feb. 2, 2016.
(Continued)

*Primary Examiner* — Ayodeji O Ayotunde
(74) *Attorney, Agent, or Firm* — Pearne & Gordon LLP (57) ABSTRACT On a substrate (200), a resistor (24R) is disposed between a position of an amplifier circuit (11) and a position of a duplexer (24), thereby reducing coupling occurring in a space between the amplifier circuit (11) and a path extending from a main switch (26) to a reception terminal (P24) through the duplexer (24). Even when an RX terminal (242) of the duplexer (24) is oriented toward an amplifier circuit (11) side, a high-frequency module (100) reduces the coupling and can thus prevent a harmonic of a transmission signal in a low band from leaking to the reception terminal (P24) through a path formed by the coupling. That is, the high-frequency module (100) can prevent a reduction in isolation characteristics in the low band and a high band and also provide flexibility in substrate layout.

8 Claims, 3 Drawing Sheets (51) Int. Cl.
  *H04B 1/50* (2006.01)
  *H01L 23/31* (2006.01)
  *H01L 23/538* (2006.01)
  *H05K 1/02* (2006.01)
(52) U.S. Cl.
  CPC ............... *H04B 1/00* (2013.01); *H04B 1/006* (2013.01); *H04B 1/50* (2013.01); *H05K 1/0206* (2013.01); *H01L 2224/48227* (2013.01)
(58) Field of Classification Search
  USPC .......................................................... 455/73
  See application file for complete search history.

(56) References Cited

FOREIGN PATENT DOCUMENTS

| | | | |
|---|---|---|---|
| JP | 2007-124202 A | 5/2007 | |
| JP | 2007-242695 A | 9/2007 | |

OTHER PUBLICATIONS

Written Opinion Issued in Patent Application No. PCT/JP2015/084487 dated Feb. 2, 2016.

\* cited by examiner

HIGH-FREQUENCY MODULE

This is a continuation of International Application No. PCT/JP2015/084487 filed on Dec. 9, 2015 which claims priority from Japanese Patent Application No. 2014-261517 filed on Dec. 25, 2014. The contents of these applications are incorporated herein by reference in their entireties.

BACKGROUND OF THE DISCLOSURE

Field of the Disclosure

The present disclosure relates to a high-frequency module that wirelessly transmits and receives signals in different bands at the same time.

Description of the Related Art

In recent years, as a communication method of wirelessly transmitting and receiving signals in different bands at the same time, carrier aggregation has been known, for example. A high-frequency module compatible with carrier aggregation has to include an antenna, a reception circuit, an amplifier circuit that amplifies a transmission signal, and a duplexer circuit on a band-by-band basis.

The reduction in size of a high-frequency module that implements carrier aggregation reduces isolation characteristics in each band. Specifically, a harmonic of a transmission signal amplified by an amplifier circuit for a low band is likely to leak to a reception circuit for a high band.

Thus, in a high-frequency module disclosed in Patent Document 1, a matching circuit included in an amplifier circuit for a low band is connected to a ground terminal on the underside of a substrate without being connected to a ground pattern within the substrate, thereby reducing the leakage of a harmonic of a transmission signal to a reception circuit for a high band through the ground pattern within the substrate.

In some cases, a harmonic of a transmission signal in the low band leaks to the reception circuit for the high band not only through the ground pattern but also through other paths. As other paths, there are paths formed by coupling (electromagnetic field coupling and capacitive coupling) occurring between elements and between transmission lines. For example, when coupling occurs in a space between an amplifier element of the amplifier circuit for the low band and an element of a duplexer circuit for the high band, a path is formed between the elements.
Patent Document 1: Japanese Unexamined Patent Application Publication No. 2007-124202

BRIEF SUMMARY OF THE DISCLOSURE

The inventors of the present application have found that adjustment of the orientation of an element of the duplexer circuit for the high band enables a reduction in coupling between the element and a circuit element for the low band. Specifically, the orientation of an element of the duplexer circuit for the high band is adjusted so that, among terminals of the element of the duplexer circuit for the high band, an RX terminal connected to the reception circuit is located on the side opposite to the amplifier circuit for the low band, thereby enabling a reduction in the above-described coupling. Not only the orientation of an element of the duplexer circuit for the high band but also the disposition of the element of the duplexer circuit for the high band and a circuit element for the low band made so that the elements are located away from each other enables a reduction in the above-described coupling.

However, such disposition of elements limits flexibility in substrate layout.

Thus, the present disclosure provides a high-frequency module that wirelessly transmits and receives signals in different bands at the same time. The high-frequency module can prevent a reduction in isolation characteristics in each band and also provide flexibility in substrate layout.

The high-frequency module includes: a first transmission and reception unit configured to transmit and receive signals within a first band (for example, a band including 900 MHz); and a second transmission and reception unit configured to transmit and receive signals within a second band (a band including 1,800 MHz) higher than the first band. The first transmission and reception unit and the second transmission and reception unit are disposed on a substrate.

Specifically, the first transmission and reception unit and the second transmission and reception unit include respective antenna terminals connected to respective antennas, respective reception terminals connected to respective reception circuits, respective amplifier circuits configured to each amplify a transmission signal, and respective duplexer circuits configured to pass respective transmission signals within the first and second bands that have been amplified by the respective amplifier circuits to the respective antenna terminals and to pass respective reception signals within the first and second bands from the respective antenna terminals to the respective reception terminals.

The amplifier circuit of the first transmission and reception unit and the amplifier circuit of the second transmission and reception unit may each include a matching circuit for impedance matching between an antenna side and a transmission and reception circuit side.

The duplexer circuit of the first transmission and reception unit is constituted by, for example, a plurality of SAW (Surface Acoustic Wave) filters so as to output a transmission signal with a center frequency of 900 MHz to the antenna terminal and output a reception signal with a center frequency of 940 MHz from the antenna terminal to the reception terminal. Similarly, the duplexer circuit of the second transmission and reception unit is constituted by a plurality of SAW filters so as to separate signals in a band including 1,800 MHz.

The high-frequency module of the present disclosure further includes a coupling inhibition element. The coupling inhibition element has no effect on transmission and reception of signals performed by the first transmission and reception unit and the second transmission and reception unit. For example, the coupling inhibition element is electrically isolated from the first transmission and reception unit and the second transmission and reception unit in the high-frequency module, thereby having no effect on transmission and reception of signals performed by the first transmission and reception unit and the second transmission and reception unit.

The coupling inhibition element of the high-frequency module of the present disclosure is disposed between a position of the duplexer circuit of the second transmission and reception unit and a position of the amplifier circuit of the first transmission and reception unit on the substrate.

When the coupling inhibition element is disposed on the substrate in this way, coupling (electromagnetic field coupling and capacitive coupling) is unlikely to occur in a space between the amplifier circuit of the first transmission and reception unit and the duplexer circuit of the second transmission and reception unit. Since the coupling is unlikely to occur, even when a harmonic of a transmission signal outputted from the amplifier circuit of the first transmission and reception unit contains a frequency component in a pass band of the duplexer circuit of the second transmission and reception unit, the harmonic is unlikely to leak to the reception terminal through a path formed by the coupling.

For example, the above-described leakage is reduced even when, among terminals of an element of the duplexer circuit of the second transmission and reception unit, an RX terminal connected to the reception terminal is oriented toward an amplifier circuit side of the first transmission and reception unit, and thus isolation characteristics in the first band and the second band are unlikely to decrease. Furthermore, the above-described leakage is reduced even when the duplexer circuit of the second transmission and reception unit and the amplifier circuit of the first transmission and reception unit are disposed close to each other, and thus isolation characteristics in each band are unlikely to decrease.

As described above, the high-frequency module of the present disclosure including the coupling inhibition element reduces the leakage of a harmonic of a transmission signal outputted from the amplifier circuit of the first transmission and reception unit to the reception terminal of the second transmission and reception unit, thereby making it possible to prevent a reduction in isolation characteristics in each band and also provide flexibility in substrate layout.

Furthermore, the coupling inhibition element may be connected to a ground of the substrate through a via conductor extending in a thickness direction of the substrate. Thus, the coupling inhibition element enables a further reduction in coupling occurring in a space within the substrate among spaces between the amplifier circuit of the first transmission and reception unit and the duplexer circuit of the second transmission and reception unit.

Furthermore, the ground electrode connected to the coupling inhibition element only through the via conductor may be electrically isolated from a ground of the first transmission and reception unit and a ground of the second transmission and reception unit on the substrate. Thus, a harmonic of a transmission signal outputted from the amplifier circuit of the first transmission and reception unit is unlikely to leak to the reception terminal of the second transmission and reception unit through a common ground pattern.

Furthermore, the coupling inhibition element may comprise an inductor and a capacitor, or may comprise a 0 (zero)-ohm chip resistor.

Even when the high-frequency module of the disclosure wirelessly transmits and receives signals in different bands at the same time, the high-frequency module can prevent a reduction in isolation characteristics in each band and also provide flexibility in substrate layout.

DETAILED DESCRIPTION OF THE DISCLOSURE

With respect to an overview of a high-frequency module 100 according to an embodiment of the present disclosure, the high-frequency module 100 transmits and receives signals (for example, 700 MHz to 2,700 MHz signals) in accordance with an LTE (Long Term Evolution) standard. To transmit and receive signals, the high-frequency module 100 amplifies a transmission signal, separates a transmission signal and a reception signal through frequency division, and switches between communication bands. The high-frequency module 100 implements carrier aggregation. That is, the high-frequency module 100 wirelessly transmits and receives signals in a plurality of bands at the same time.

In the high-frequency module 100, a coupling inhibition element is disposed between a position of an amplifier circuit for a low band and a position of a duplexer circuit for a high band on a substrate, thereby reducing the leakage of a harmonic of a transmission signal outputted from the amplifier circuit for the low band to a reception circuit for the high band.

The coupling inhibition element inhibits coupling (electromagnetic field coupling and capacitive coupling) between elements and between transmission lines. In the embodiment, a description will be given using, as a coupling inhibition element, a chip resistor of a 0 (zero)-ohm resistor.

Figure 1:
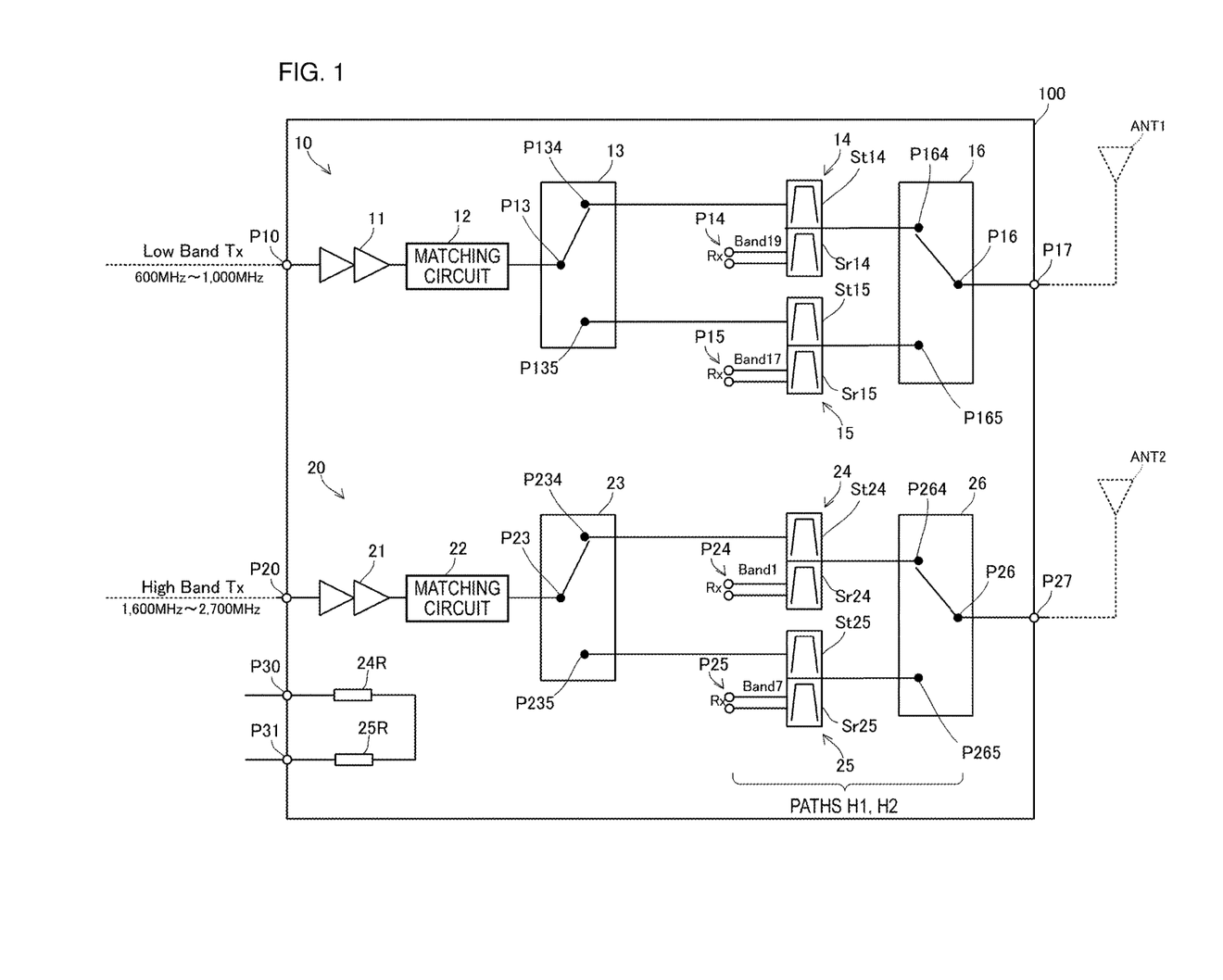
FIG. 1 illustrates an example of a circuit of a high-frequency module according to an embodiment of the present disclosure.

Next, the high-frequency module 100 will be described in detail with reference to FIG. 1. FIG. 1 illustrates an example of a circuit of the high-frequency module 100.

As illustrated in FIG. 1, the high-frequency module 100 includes a low-band transmission and reception unit 10 and a high-band transmission and reception unit 20.

The low-band transmission and reception unit 10 includes an input terminal P10 and a first antenna terminal P17. A transmission signal in a low band is inputted to the input terminal P10. The first antenna terminal P17 is connected to a first antenna ANT1 for the low band. The high-band transmission and reception unit 20 includes an input terminal P20 and a second antenna terminal P27. A transmission signal in a higher band than the transmission signal in the low band is inputted to the input terminal P20. The second antenna terminal P27 is connected to a second antenna ANT2 for a high band.

In the embodiment, a description will be given by taking, as an example, the case where a frequency band of 600 MHz to 1,000 MHz in which the low-band transmission and reception unit 10 mainly performs transmission and reception and a frequency band of 1,600 MHz to 2,700 MHz in which the high-band transmission and reception unit 20 mainly performs transmission and reception are respectively defined as a first band and a second band.

The low-band transmission and reception unit 10 includes an amplifier circuit 11, a matching circuit 12, a sub-switch 13, a plurality of duplexers 14 and 15, and a main switch 16.

The amplifier circuit 11 amplifies a transmission signal in a low band (600 MHz to 1,000 MHz) that has been inputted to the input terminal P10 and outputs the amplified transmission signal to the matching circuit 12. The matching circuit 12 includes an inductor and a capacitor, for example, and matches the impedance on a first antenna ANT1 side to that on an amplifier circuit 11 side.

The sub-switch 13 includes a common terminal P13 and a plurality of individual terminals P134 and P135. The common terminal P13 is connected to the matching circuit 12. The individual terminal P134 is connected to the duplexer 14. The individual terminal P135 is connected to the duplexer 15.

To select a duplexer to be used in a path between the matching circuit 12 and the first antenna ANT1 from the duplexer 14 and the duplexer 15, the main switch 16 performs switching of a connection between the matching circuit 12 and either duplexer and switching of a connection between the duplexer and the first antenna terminal P17 in combination with the sub-switch 13. Note that switching is performed on the basis of a control signal outputted from a control IC 213 (see FIG. 2A).

The duplexer 14 separates a transmission signal and a reception signal through frequency division in an LTE standard band 19 (800 MHz band), for example. Specifically, the duplexer 14 includes a common terminal and two individual terminals. The duplexer 14 includes a transmission-side filter St14 and a reception-side filter Sr14 that are integrally formed in a single housing. The reception-side filter Sr14 has a balanced-unbalanced transforming function.

The common terminal of the duplexer 14 is connected to an individual terminal P164 of the main switch 16. The transmission-side filter St14 and the individual terminal P134 of the sub-switch 13 are connected to one individual terminal of the duplexer 14. The reception-side filter Sr14 and a reception terminal P14 are connected to the other individual terminal of the duplexer 14. The reception terminal P14 is connected to a reception circuit (not illustrated) in or on a main substrate other than a substrate on which the high-frequency module 100 is implemented.

The transmission-side filter St14 is a SAW (Surface Acoustic Wave) filter, for example, and is a filter with a band of 830 MHz to 845 MHz as a pass band and the other bands as an attenuation band. The reception-side filter Sr14 is a SAW filter, for example, and is a filter with a band of 875 MHz to 890 MHz as a pass band and the other bands as an attenuation band. Note that a BAW (Bulk Acoustic Wave) filter can be used in place of a SAW filter.

The duplexer 15 separates a transmission signal and a reception signal through frequency division in an LTE standard band 17 (700 MHz band), for example. Specifically, the duplexer 15 includes a common terminal and two individual terminals. The duplexer 15 includes a transmission-side filter St15 and a reception-side filter Sr15 that are integrally formed in a single housing. The reception-side filter Sr15 has a balanced-unbalanced transforming function.

The common terminal of the duplexer 15 is connected to an individual terminal P165 of the main switch 16. The transmission-side filter St15 and the individual terminal P135 of the sub-switch 13 are connected to one individual terminal of the duplexer 15. The reception-side filter Sr15 and a reception terminal P15 are connected to the other individual terminal of the duplexer 15. The reception terminal P15 is connected to the reception circuit (not illustrated) in or on the main substrate other than the substrate on which the high-frequency module 100 is implemented.

The transmission-side filter St15 is a SAW filter, for example, and is a filter with a band of 704 MHz to 716 MHz as a pass band and the other bands as an attenuation band. The reception-side filter Sr15 is a SAW filter, for example, and is a filter with a band of 734 MHz to 746 MHz as a pass band and the other bands as an attenuation band.

A common terminal P16 of the main switch 16 is connected to the first antenna terminal P17. The first antenna ANT1 has a shape suitable for transmission and reception of signals in the low band.

The high-band transmission and reception unit 20 has the same structure as the low-band transmission and reception unit 10 and differs from the low-band transmission and reception unit 10 in band of signals to be transmitted and received. The high-band transmission and reception unit 20 includes an amplifier circuit 21, a matching circuit 22, a sub-switch 23, a plurality of duplexers 24 and 25, and a main switch 26.

The amplifier circuit 21 amplifies a transmission signal in a high band (1,600 MHz to 2,700 MHz) that has been inputted to the input terminal P20 and outputs the amplified transmission signal to the matching circuit 22. The matching circuit 22 includes an inductor and a capacitor, for example, and matches the impedance on a second antenna ANT2 side to that on an amplifier circuit 21 side.

The sub-switch 23 includes a common terminal P23, and a plurality of individual terminals P234 and P235. The common terminal P23 is connected to the matching circuit 22. The individual terminal P234 is connected to the duplexer 24. The individual terminal P235 is connected to the duplexer 25.

To select a duplexer to be used in a connection path between the matching circuit 22 and the second antenna ANT2 from the duplexer 24 and the duplexer 25, the main switch 26 performs switching of a connection between the matching circuit 22 and either duplexer and switching of a connection between the duplexer and the second antenna terminal P27 in combination with the sub-switch 23. Note that switching is performed on the basis of a control signal outputted from the control IC 213.

The duplexer 24 separates a transmission signal and a reception signal through frequency division in an LTE standard band 1 (2,100 MHz band), for example. Specifically, the duplexer 24 includes a common terminal and two individual terminals. The duplexer 24 includes a transmission-side filter St24 and a reception-side filter Sr24 that are integrally formed in a single housing. The reception-side filter Sr24 has a balanced-unbalanced transforming function.

The common terminal of the duplexer 24 is connected to an individual terminal P264 of the main switch 26. The transmission-side filter St24 is connected to one individual terminal of the duplexer 24. The reception-side filter Sr24 and a reception terminal P24 are connected to the other individual terminal of the duplexer 24. The reception terminal P24 is connected to a reception circuit (not illustrated) in or on the main substrate other than the substrate on which the high-frequency module 100 is implemented.

The transmission-side filter St24 is a SAW filter, for example, and is a filter with a band of 1,920 MHz to 1,980 MHz as a pass band and the other bands as an attenuation band. The reception-side filter Sr24 is a SAW filter, for example, and is a filter with a band of 2,110 MHz to 2,170 MHz as a pass band and the other bands as an attenuation band.

The duplexer 25 separates a transmission signal and a reception signal through frequency division in an LTE standard band 7 (2,600 MHz band), for example. Specifically, the duplexer 25 includes a common terminal and two individual terminals. The duplexer 25 includes a transmission-side filter St25 and a reception-side filter Sr25 that are integrally formed in a single housing. The reception-side filter Sr25 has a balanced-unbalanced transforming function.

The common terminal of the duplexer 25 is connected to an individual terminal P265 of the main switch 26. The transmission-side filter St25 is connected to one individual terminal of the duplexer 25. The reception-side filter Sr25 and a reception terminal P25 are connected to the other individual terminal of the duplexer 25. The reception terminal P25 is connected to the reception circuit (not illustrated) in or on the main substrate other than the substrate on which the high-frequency module 100 is implemented.

The transmission-side filter St25 is a SAW filter, for example, and is a filter with a band of 2,500 MHz to 2,570 MHz as a pass band and the other bands as an attenuation band. The reception-side filter Sr25 is a SAW filter, for example, and is a filter with a band of 2,620 MHz to 2,690 MHz as a pass band and the other bands as an attenuation band.

A common terminal P26 of the main switch 26 is connected to the second antenna terminal P27. The second antenna ANT2 is formed so as to have a shape suitable for transmission and reception of signals in the high band.

The operation of the high-frequency module 100 will be described by taking, as an example, the case where transmission and reception are performed in the LTE standard band 19. In the case where transmission and reception are performed in the LTE standard band 19, the control IC 213 performs control in which a connection of the sub-switch 13 and a connection of the main switch 16 are each switched to output a transmission signal to the first antenna ANT1 through the duplexer 14. Specifically, the control IC 213 outputs a control signal to the sub-switch 13 and the main switch 16 so that the common terminal P13 and the individual terminal P134 are connected to each other and the common terminal P16 and the individual terminal P164 are connected to each other.

After a transmission signal inputted to the input terminal P10 is amplified by the amplifier circuit 11, the transmission signal passes through the matching circuit 12, the sub-switch 13, and the transmission-side filter St14 of the duplexer 14 sequentially and is thus filtered so that frequency components of 830 MHz to 845 MHz serve as main frequency components. Subsequently, the transmission signal passes through the main switch 16 and the first antenna terminal P17 sequentially and is then outputted to the first antenna ANT1.

With respect to reception in the LTE standard band 19, a reception signal received by the first antenna ANT1 passes through the first antenna terminal P17 and the main switch 16 sequentially and is then inputted to the duplexer 14. For the reception signal, frequency components of 875 MHz to 890 MHz are outputted to the reception terminal P14 by the reception-side filter Sr14.

The high-frequency module 100 also wirelessly transmits and receives signals in a band other than the LTE standard band 19 at the same time to implement carrier aggregation. A description will be given below by taking the case where a band in which signals are transmitted and received at the same time as signals are transmitted and received in the LTE standard band 19 is the band 1. In the case where signals are transmitted and received in the LTE standard band 1, the control IC 213 performs control in which a connection of the sub-switch 23 and a connection of the main switch 26 are each switched to output a transmission signal to the second antenna ANT2 through the duplexer 24. Specifically, the control IC 213 outputs a control signal to the sub-switch 23 and the main switch 26 so that the common terminal P23 and the individual terminal P234 are connected to each other and the common terminal P26 and the individual terminal P264 are connected to each other.

After a transmission signal inputted to the input terminal P20 is amplified by the amplifier circuit 21, the transmission signal passes through the matching circuit 22, the sub-switch 23, and the transmission-side filter St24 of the duplexer 24 sequentially and is thus filtered so that frequency components of 1,920 MHz to 1,980 MHz serve as main frequency components. Subsequently, the transmission signal passes through the individual terminal P264 and the common terminal P26 of the main switch 26, and the second antenna terminal P27 sequentially and is then outputted to the second antenna ANT2.

With respect to reception in the LTE standard band 1, a reception signal received by the second antenna ANT2 passes through the second antenna terminal P27 and the main switch 26 sequentially and is then inputted to the duplexer 24. For the reception signal, frequency components of 2,110 MHz to 2,170 MHz are outputted to the reception terminal P24 by the reception-side filter Sr24.

As described above, the high-frequency module 100 wirelessly transmits and receives signals in the LTE standard band 19 (low band) and the LTE standard band 1 (high band) at the same time. The high-frequency module 100 wirelessly transmits and receives signals in the band 17 and the band 7 at the same time. Furthermore, the high-frequency module 100 may deal with not only two bands but also three or more bands that differ from one another in frequencies in each pass band. Signals may be transmitted and received in a plurality of bands that are two low bands and one high band at the same time. When the high-frequency module 100 transmits and receives signals in three pass bands that are two low bands and one high band at the same time, these pass bands, three in all, may be defined as a low band, a middle band, and a high band. Among three or more pass bands, either a low band or a high band may be set to contain a plurality of pass bands that are different from one another.

The high-frequency module 100 according to the embodiment includes a resistor 24R and a resistor 25R to reduce the leakage of a harmonic of a transmission signal in the low band that has been outputted from the amplifier circuit 11 to the reception terminals P24 and P25 of the high-band transmission and reception unit 20. The resistor 24R and the resistor 25R are each a chip resistor of a 0 (zero)-ohm resistor. Note that the high-frequency module 100 may include other elements, such as an inductor and a capacitor, in place of the resistor 24R and the resistor 25R.

As illustrated in FIG. 1, the resistor 24R and the resistor 25R are connected in series between an input terminal P30 and an output terminal P31 of the high-frequency module 100. The resistor 24R and the resistor 25R are electrically isolated from the low-band transmission and reception unit 10 and the high-band transmission and reception unit 20. That is, the resistor 24R and the resistor 25R have no effect on transmission and reception of signals performed by the low-band transmission and reception unit 10 and the high-band transmission and reception unit 20.

Figure 2A:
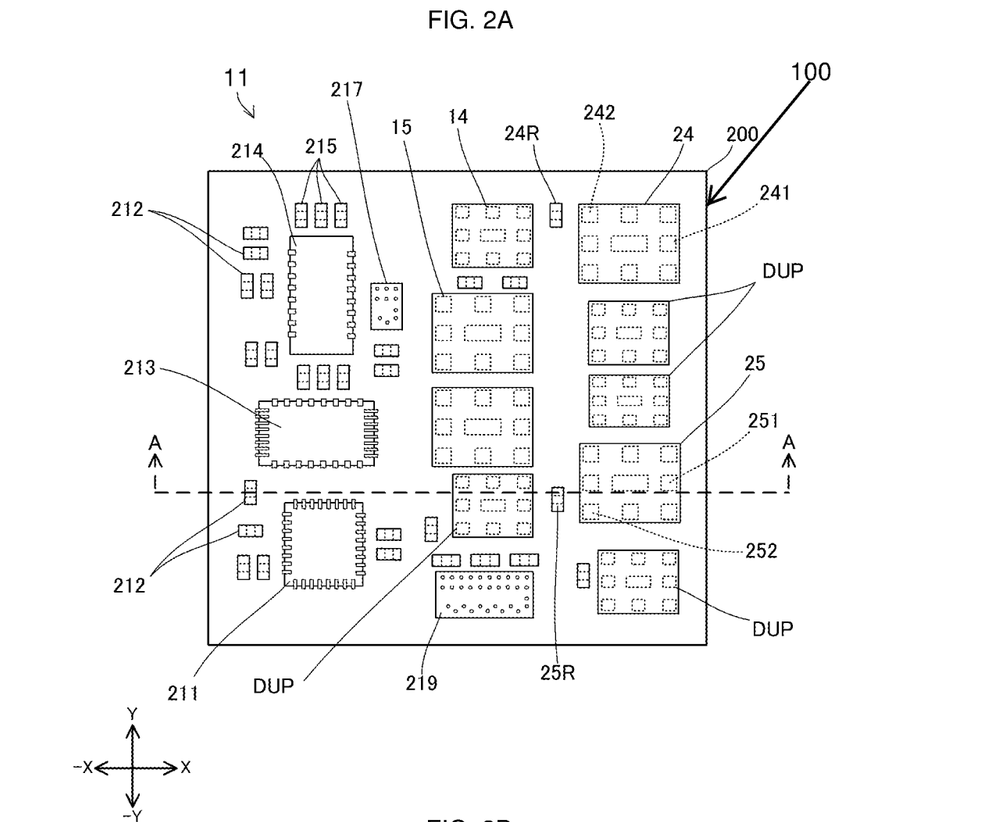
FIG. 2A is a top surface (element mounting surface) view of the high-frequency module according to the embodiment of the present disclosure.
Figure 2B:
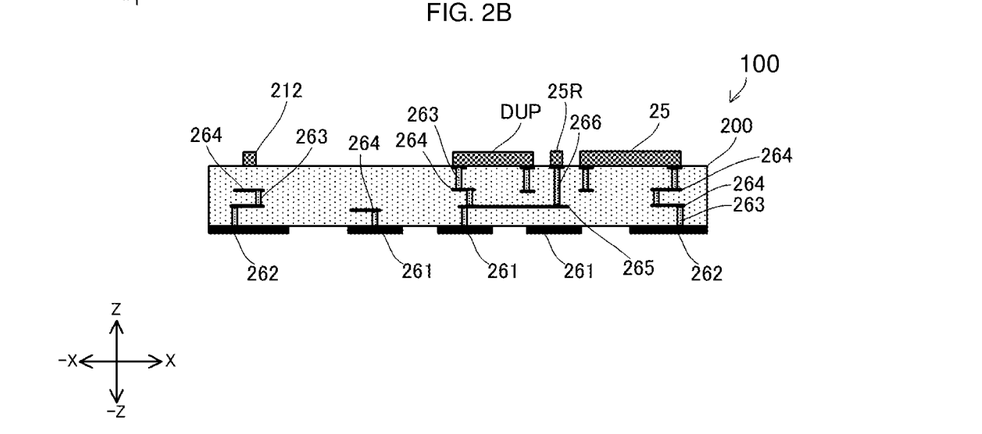
FIG. 2B is an A-A cross-sectional view.

The disposition of circuit elements of the high-frequency module 100 including the resistor 24R and the resistor 25R on the substrate will be described below with reference to FIG. 2A and FIG. 2B. FIG. 2A is a top surface (element mounting surface) view of the high-frequency module 100. FIG. 2B is an A-A cross-sectional view.

As illustrated in FIG. 2A, the high-frequency module 100 includes a plurality of elements that constitute the example of the circuit illustrated in FIG. 1 and are disposed on a substrate 200. Specifically, on the substrate 200, an IC 211, the control IC 213, a plurality of chip elements (any of resistors, capacitors, inductors, and the like) 212, the duplexers 14, 15, 24, and 25, a switch IC 217 including the sub-switches 13 and 23, and a switch IC 219 including the main switches 16 and 26 are disposed.

When the substrate 200 is viewed in plan, an amplifier element 214 and a plurality of chip elements 215 are disposed in a corner on a −X-side and a +Y-side of the substrate 200. The amplifier element 214 and the plurality of chip elements 215 are elements constituting the amplifier circuit 11 of the low-band transmission and reception unit 10.

When the substrate 200 is viewed in plan, the duplexer 24 and the duplexer 25 are disposed on a +X-side of the substrate 200. Note that the high-frequency module 100 actually includes a duplexer DUP in addition to the duplexers 14, 15, 24, and 25, and more duplexers are thus illustrated in FIG. 2A.

Here, the duplexer 24 includes a TX terminal 241 connected to the sub-switch 23 and an RX terminal 242 connected to the reception terminal P24. The duplexer 25 includes a TX terminal 251 connected to the sub-switch 23 and an RX terminal 252 connected to the reception terminal P25.

As illustrated in FIG. 2A, the RX terminal 242 is disposed on a −X-side of the duplexer 24 when the substrate 200 is viewed in plan. The TX terminal 241 is disposed on a +X-side of the duplexer 24 when the substrate 200 is viewed in plan. In other words, the duplexer 24 is oriented so that the RX terminal 242 connected to the reception circuit through the reception terminal P24 is located on the amplifier circuit 11 side further than the TX terminal 241. The RX terminal 252 is disposed on a −X-side of the duplexer 25 when the substrate 200 is viewed in plan. The TX terminal 251 is disposed on a +X-side of the duplexer 25 when the substrate 200 is viewed in plan. In other words, the duplexer 25 is oriented so that the RX terminal 252 connected to the reception circuit through the reception terminal P25 is located on the amplifier circuit 11 side further than the TX terminal 251.

Here, in a high-frequency module in related art not including the resistor 24R and the resistor 25R, when an RX terminal of a duplexer for a high band is oriented toward an amplifier circuit side, coupling occurs in a space between an amplifier circuit concerned and a path extending from the RX terminal to a reception circuit in some cases. In some cases, this coupling causes the leakage of a harmonic of a transmission signal outputted from the amplifier circuit for a low band to the reception circuit for the high band. The harmonic is a harmonic containing a frequency component in a pass band of a duplexer circuit for the high band.

Thus, in the high-frequency module 100 according to the embodiment, on the substrate 200, the resistor 24R and the resistor 25R are disposed between respective positions of the duplexers 24 and 25 and a position of the amplifier circuit 11, thereby preventing a harmonic of a transmission signal in the low band from leaking to the reception terminals P24 and P25.

Specifically, as illustrated in FIG. 2A, on the substrate 200, the resistor 24R is disposed between the position of the duplexer 24 and the position of the amplifier circuit 11. That is, on the substrate 200, the resistor 24R is disposed between the position of the duplexer 24 and respective positions of the amplifier element 214 and the plurality of chip elements 215.

The resistor 24R is disposed in this way and is thus spatially located between the amplifier circuit 11 and a path H1 extending from the main switch 26 to the reception terminal P24 through the duplexer 24. Thus, electromagnetic field coupling and capacitive coupling (Hereinafter, they are merely referred to as coupling.) are unlikely to occur in a space between the amplifier circuit 11 and the path H1. For example, coupling is unlikely to occur in a space between the amplifier element 214 constituting the amplifier circuit 11 and the duplexer 24 included in the path H1. As a result, the high-frequency module 100 reduces the leakage of a harmonic of a transmission signal outputted from the amplifier circuit 11 to the reception terminal P24 through a path formed by the coupling.

Similarly, on the substrate 200, the resistor 25R is disposed between the position of the duplexer 25 and the position of the amplifier circuit 11. That is, on the substrate 200, the resistor 25R is disposed between the position of the duplexer 25 and the respective positions of the amplifier element 214 and the plurality of chip elements 215.

The resistor 25R is disposed in this way and is thus spatially located between the amplifier circuit 11 and a path H2 extending from the main switch 26 to the reception terminal P25 through the duplexer 25. Thus, coupling is unlikely to occur in a space between the amplifier circuit 11 and the path H2. As a result, the high-frequency module 100 reduces the leakage of a harmonic of a transmission signal outputted from the amplifier circuit 11 to the reception terminal P25 through a path formed by the coupling.

Furthermore, even when the duplexer 24 and the duplexer 25 are disposed close to the amplifier circuit 11, the resistor 24R and the resistor 25R reduce coupling occurring in spaces between the amplifier circuit 11 and the paths H1 and H2, thereby reducing coupling occurring in spaces between the amplifier element 214 constituting the amplifier circuit 11 and the duplexer 24 and the duplexer 25 that are included in the paths H1 and H2.

As described above, even when the RX terminals 242 and 252 of the duplexers 24 and 25 are oriented toward the amplifier circuit 11 side, or even when the duplexers 24 and 25 are disposed close to the amplifier circuit 11, the high-frequency module 100 can prevent a harmonic of a transmission signal in the low band from leaking to the reception terminals P24 and P25. That is, the high-frequency module 100 according to the embodiment can prevent a reduction in isolation characteristics in each LTE standard band and also provide flexibility in setting of the positions and orientations of elements including the duplexers 24 and 25 and the amplifier element 214 on the substrate 200 (Hereinafter, it is referred to as a substrate layout.).

Furthermore, the resistor 24R and the resistor 25R are each a chip element having a solid shape and takes a shape that protrudes in the direction of the normal to the top surface of the substrate 200 when mounted on the substrate 200. The high-frequency module 100 may include a coupling inhibition element that is larger in the amount of protrusion. That is, the high-frequency module 100 may include a coupling inhibition element having a shape that protrudes higher in the direction of the normal to the top surface of the substrate 200. The higher the shape of the coupling inhibition element protrudes, the higher the effect of inhibiting the above-described coupling is.

Furthermore, with respect to details of the disposition of the resistor 24R and the resistor 25R, on the substrate 200, the resistor 24R is disposed between a position of the RX terminal 242 of the duplexer 24 and the position of the amplifier element 214. The resistor 24R is disposed on an RX terminal 242 side between these positions. In the high-frequency module 100, on the substrate 200, the resistor 24R is disposed at a position closer to the position of the RX terminal 242, thereby enabling a further reduction in coupling occurring in a space between the amplifier circuit 11 and a path extending from the RX terminal 242 to the reception terminal P24.

Similarly, on the substrate 200, the resistor 25R is disposed between a position of the RX terminal 252 of the duplexer 25 and the position of the amplifier element 214. The resistor 25R is disposed on an RX terminal 252 side between these positions. In the high-frequency module 100, on the substrate 200, the resistor 25R is disposed at a position closer to the position of the RX terminal 252, thereby enabling a more effective reduction in coupling occurring in a space between the amplifier circuit 11 and a path extending from the RX terminal 252 to the reception terminal P25.

As illustrated in the cross-sectional view of FIG. 2B, the resistor 25R is connected to a ground electrode 261 through a via conductor 266 extending in a thickness direction (Z direction) of the substrate 200 and an internal line 265. Ground electrodes 261 are disposed on a lower surface opposite to the mounting surface (top surface) of the substrate 200 on which the amplifier element 214, the duplexers 24 and 25, and the resistors 24R and 25R are mounted. With respect to the duplexers 25 and DUP, their respective terminals are connected to an electrode 262 and the ground electrode 261 through respective internal lines 264 and respective via conductors 263. Although not included in the figure, the resistor 24R is also connected to a ground electrode through a via conductor and an internal line.

In the high-frequency module 100, the resistor 24R and the resistor 25R are connected to respective via conductors 266 connected to a ground, also thereby enabling a reduction in coupling occurring in a space within the substrate 200 among spaces between the amplifier circuit 11 and the paths H1 and H2. Note that the resistor 24R and the resistor 25R may be connected to respective via conductors that are not connected to the ground. Furthermore, the resistor 24R and the resistor 25R may simply be mounted on the top surface of the substrate 200 and do not have to be connected to a wiring pattern on the substrate 200.

Figure 3:
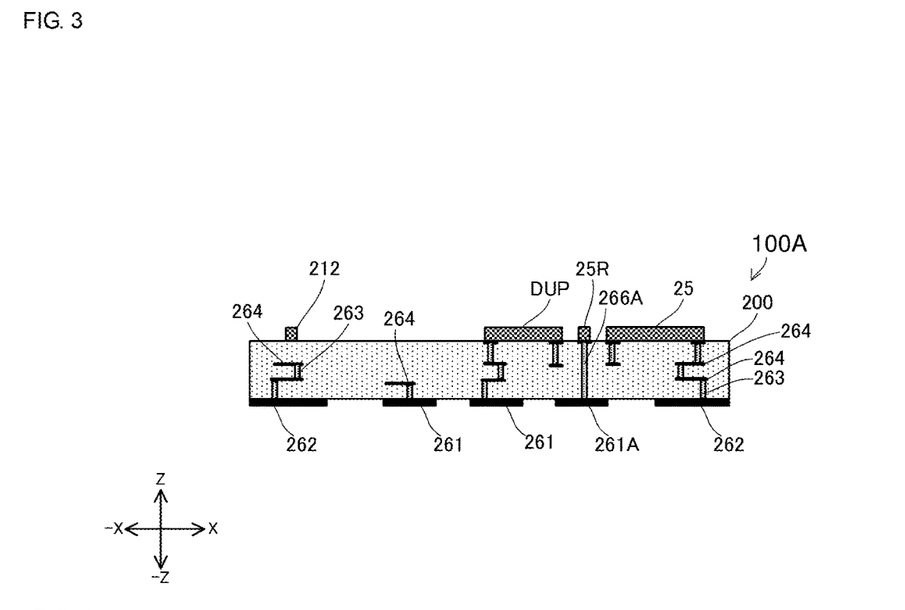
FIG. 3 is a cross-sectional view of a high-frequency module according to Modification 1 of the high-frequency module according to the embodiment of the present disclosure.

Next, FIG. 3 is a cross-sectional view of a high-frequency module 100A according to Modification 1 of the high-frequency module 100. In the high-frequency module 100A according to Modification 1, the resistor 25R is connected to a ground electrode 261A only through a via conductor 266A.

Thus, in the high-frequency module 100A, the via conductor 266A and the resistor 25R are connected to each other without being connected to an internal line, thereby making it possible to enhance the effect of reducing the above-described coupling.

Furthermore, as illustrated in FIG. 3, the ground electrode 261A connected to the resistor 25R only through the via conductor 266A differs from the ground electrodes 261 to which components, such as duplexers DUP, that are included in the low-band transmission and reception unit 10 and the high-band transmission and reception unit 20 are connected. Thus, a harmonic of a transmission signal outputted from the amplifier circuit 11 is unlikely to leak to the reception terminals P24 and P25 through a common internal line and a common ground electrode.

Although, in the examples described above, a resistor serving as a coupling inhibition element is provided for each duplexer, more resistors may be provided as follows.

Figure 4:
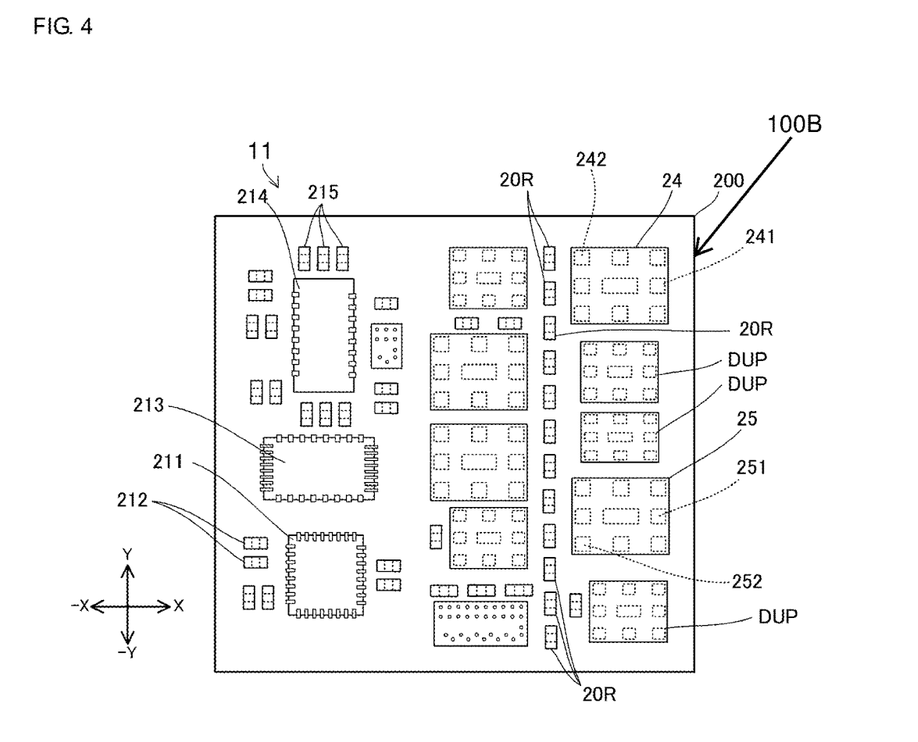
FIG. 4 is a top surface (element mounting surface) view of a high-frequency module according to Modification 2 of the high-frequency module according to the embodiment of the present disclosure.

FIG. 4 is a top surface (element mounting surface) view of a high-frequency module 100B according to Modification 2 of the high-frequency module 100. The high-frequency module 100B differs from the high-frequency module 100 in that a plurality of resistors 20R are disposed so that duplexers of the high-band transmission and reception unit 20 including the duplexers 24 and 25 are partitioned from the amplifier circuit 11.

As illustrated in FIG. 4, the plurality of resistors 20R are arranged in a Y direction. Thus, coupling is further unlikely to occur in spaces between the amplifier circuit 11 and the paths H1 and H2 extending from the main switch 26 to the reception terminals P24 and P25 through the duplexers 24 and 25.

10 low-band transmission and reception unit
11 amplifier circuit
12 matching circuit
13 sub-switch
14, 15 duplexer
16 main switch
20 high-band transmission and reception unit
20R resistor
21 amplifier circuit
22 matching circuit
23 sub-switch
24, 25 duplexer
24R, 25R resistor
26 main switch
100, 100A, 100B high-frequency module
200 substrate
211 IC
213 control IC
214 amplifier element
212, 215 chip element
217, 219 switch IC
241, 251 TX terminal
242, 252 RX terminal
261, 261A ground electrode
262 electrode
263, 266, 266A via conductor
264, 265 internal line The ivention claimed is:

1. A high-frequency module comprising:
   a first transmission and reception unit configured to transmit and receive signals within a first band; and
   a second transmission and reception unit configured to transmit and receive signals within a second band higher than the first band,
   wherein the first transmission and reception unit and the second transmission and reception unit are disposed on a substrate,
   wherein the first transmission and reception unit and the second transmission and reception unit include respective antenna terminals connected to respective antennas, respective reception terminals connected to respective reception circuits, respective amplifier circuits configured to each amplify a transmission signal, and respective duplexer circuits configured to pass respective transmission signals within the first and second bands amplified by the respective amplifier circuits to the respective antenna terminals and to pass respective reception signals within the first and second bands from the respective antenna terminals to the respective reception terminals, and
   wherein the high-frequency module further comprises a coupling inhibition element disposed between a position of the duplexer circuit of the second transmission and reception unit and a position of the amplifier circuit of the first transmission and reception unit on the substrate and having no effect on transmission and reception of signals performed by the first transmission and reception unit and the second transmission and reception unit.

2. The high-frequency module according to claim 1, wherein the coupling inhibition element is connected to a ground of the substrate through a via conductor extending in a thickness direction of the substrate.

3. The high-frequency module according to claim 2, wherein the substrate includes a first surface on which the coupling inhibition element is mounted, and a second surface opposite to the first surface,
wherein the substrate further includes a plurality of ground electrodes provided on the second surface, and
wherein the coupling inhibition element is connected to the ground electrode only through the via conductor.

4. The high-frequency module according to claim 3, wherein the ground electrode connected to the coupling inhibition element only through the via conductor is electrically isolated from a ground of the first transmission and reception unit and a ground of the second transmission and reception unit on the substrate.

5. The high-frequency module according to claim 1, wherein the coupling inhibition element comprises a zero-ohm chip resistor.

6. The high-frequency module according to claim 2, wherein the coupling inhibition element comprises a zero-ohm chip resistor.

7. The high-frequency module according to claim 3, wherein the coupling inhibition element comprises a zero-ohm chip resistor.

8. The high-frequency module according to claim 4, wherein the coupling inhibition element comprises a zero-ohm chip resistor.

\* \* \* \* \*